(12) United States Patent
Levine et al.

(10) Patent No.: US 6,472,653 B1
(45) Date of Patent: Oct. 29, 2002

(54) METHOD AND APPARATUS TO EXTEND DYNAMIC RANGE OF TIME DELAY AND INTEGRATE CHARGE COUPLED DEVICES

(75) Inventors: Peter Alan Levine, West Windsor; Nathaniel Joseph McCaffrey, Stockton, both of NJ (US); Gary William Hughes, Westlake Village, CA (US); Kantilal Patel, South Brunswick, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/528,818

(22) Filed: Mar. 20, 2000

Related U.S. Application Data

(60) Provisional application No. 60/125,670, filed on Mar. 22, 1999.

(51) Int. Cl.[7] .............................................. H01L 27/00
(52) U.S. Cl. ................................... 250/208.1; 348/295
(58) Field of Search .......................... 250/208.1, 214.1; 348/295, 314

(56) References Cited

U.S. PATENT DOCUMENTS

| | | | |
|---|---|---|---|
| 3,953,733 A | * | 4/1976 | Levine ........................ 350/330 |
| 4,627,084 A | | 12/1986 | McIver |
| 4,695,889 A | | 9/1987 | Portmann |
| 5,040,038 A | * | 8/1991 | Yutani et al. ................ 257/232 |
| 5,113,263 A | | 5/1992 | Audaire et al. |
| 5,114,237 A | | 5/1992 | Cazaux |
| 5,276,520 A | * | 1/1994 | Hawkins et al. ............ 348/299 |
| 5,418,563 A | | 5/1995 | Dischert et al. |
| 6,101,294 A | * | 8/2000 | McCaffrey et al. ......... 382/312 |

OTHER PUBLICATIONS

An Adaptive Sensitivity TDI Sensor; Presented a t Conference on AFPAEC96, Oct. 1996, Berlin, Germany, pp. 1–5.

* cited by examiner

*Primary Examiner*—Stephone Allen
*Assistant Examiner*—Eric Spears
(74) *Attorney, Agent, or Firm*—William J. Burke

(57) ABSTRACT

A novel method and apparatus is disclosed that is able to extend the intra-scene dynamic range of Time Delay and Integrate Charge-Coupled Device imagers. In accordance with the principles of the invention, the charge collected and accumulated over a plurality of photosensitive devices is limited by adjusting the barrier levels at which collected accumulated charge is removed from the photosensitive devices. By limiting the amount of accumulated charge that is collected, images of high intensity are prevented from overflowing or saturating the photosensitive devices. Thus, information that is included in the brighter levels of the image is not lost because of clipping the photosensitive device to prevent saturation. In one embodiment of the invention, the blooming barrier levels are adjusted in a step-wise linear manner to allow a known amount of charge to be retained during the initial collection phase while allowing progressively greater amounts of charge to be retained as the collection phase proceeds. This stepped increase in barrier level causes the imager to compress highly intense images to prevent saturation during the initial collection phase, while not influencing the response to images of lower intensity.

23 Claims, 6 Drawing Sheets

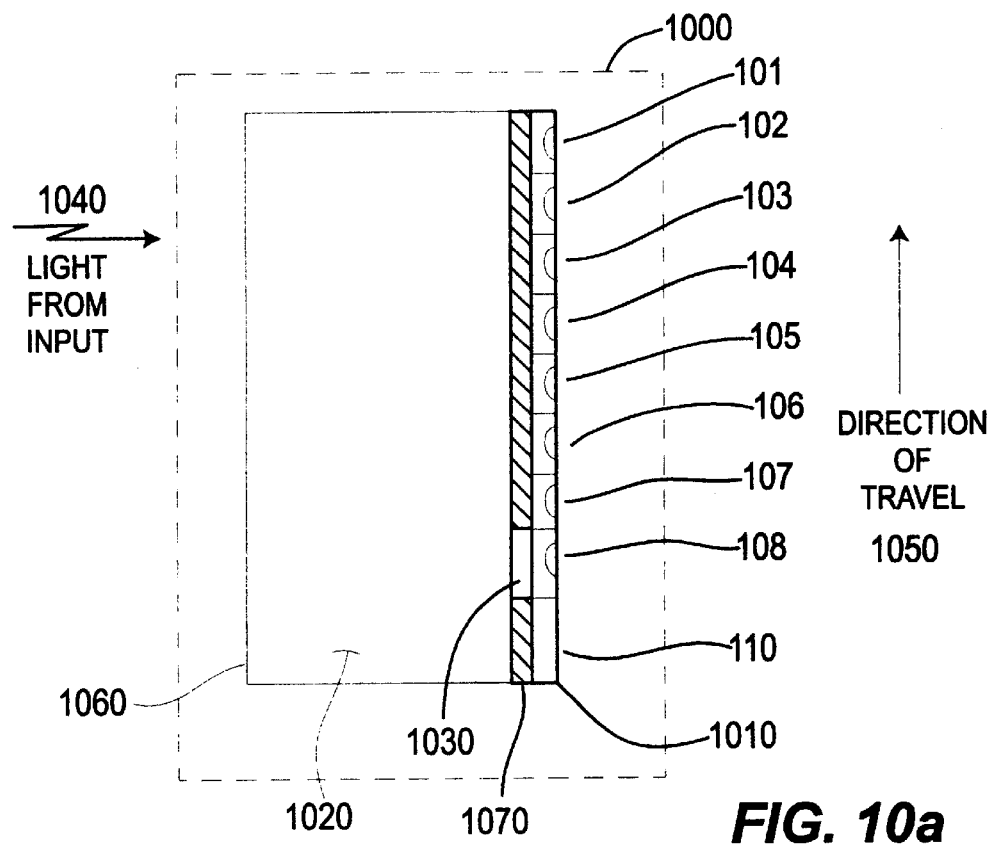
FIG. 10a
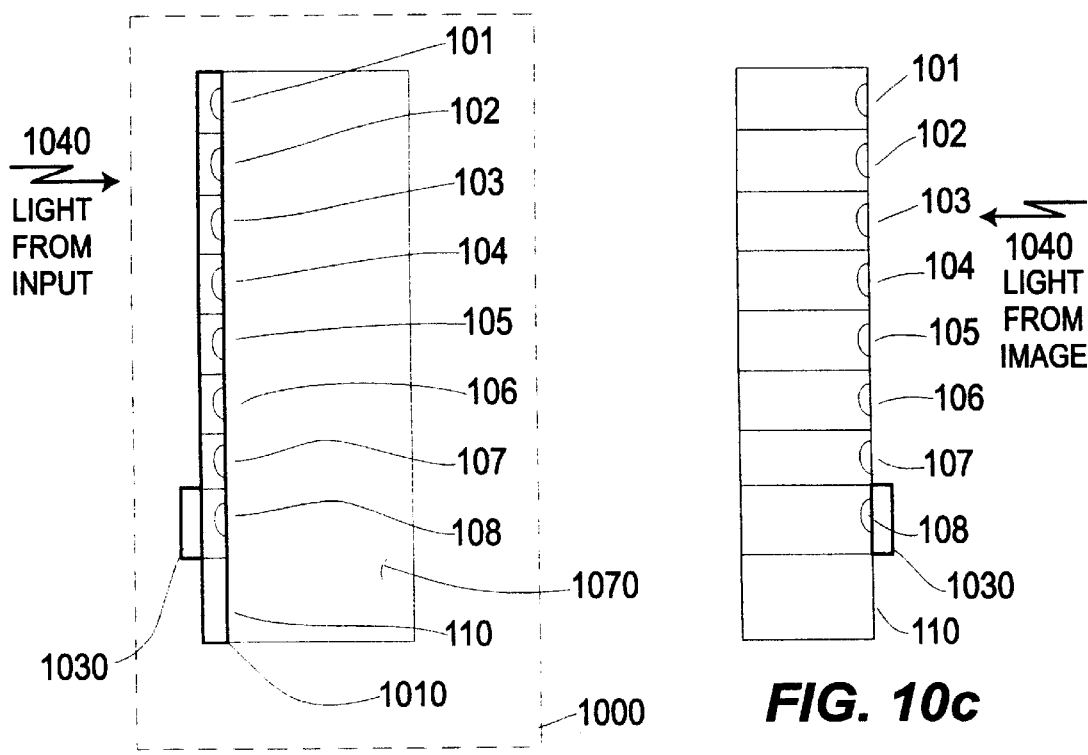
FIG. 10b
FIG. 10c

METHOD AND APPARATUS TO EXTEND DYNAMIC RANGE OF TIME DELAY AND INTEGRATE CHARGE COUPLED DEVICES

CROSS REFERENCE TO RELATED APPLICATIONS

This application relates to Provisional Application Serial No. 60/125,670, entitled, "TIME DELAY AND INTEGRATE CCD WITH EXTENDED DYNAMIC RANGE" filed on Mar. 22, 1999, which is assigned to the same assignee and is incorporated by reference herein. Applicant claims the benefit of the priority filing date of Mar. 22, 1999 pursuant 35 U.S.C. §119(e)(1).

FIELD OF THE INVENTION

The present invention is related to the field of imaging devices. More specifically, to extending the dynamic range of Time Delay and Integrate (TDI) imagers,

BACKGROUND OF THE INVENTION

Typical single line imagers, for example, Charge Coupled Device (CCD) imagers, incorporate a single row of photosensitive electrical devices, such as photo-detectors, to collect photonic charge. A photo-detector converts the collected photonic charge into an electrical charge that is related to the amount of photonic charge collected. In moving target imaging the detector integration time is limited by the allowable time the target image moves past the imaging device or scanner. Consequently, as the target image velocity across the imager increases, the allowable time to collect photonic charge decreases. A Time Delay & Integration (TDI) method of operating CCD imagers incorporates multiple single row CCD scanners in an imaging array. Each row in the array collects image data for a finite period of time as the target image and the imager move relative to each other. Typically, the collected charge moves from one row to the next at the same speed as the target image moves across the imager to prevent blurring. TDI-CCD scanners offer an advantage over single line scanners in that TDI-CCD devices provide for longer times to collect and integrate photonic charge from the target image. The longer collection time also increases the sensitivity of the imager.

However, when TDI-CCD devices are used to collect highly intense images, the longer integration time may cause the accumulated charge to exceed the capability of the photosensitive devices. To prevent the excess charge from influencing adjacent photosensitive devices, the excess charge is generally drained away. This draining causes details of an image to be lost. One method of avoiding this loss of detail is to increase the level that is deemed excessive charge—i.e., increase the threshold beyond which charge drainage begins. This method, however, has the disadvantage that the maximum threshold drainage level is set by the saturation level of the photosensitive device. In this case, information is lost not because of draining of the excessive charge, but rather from the inability of the cells to collect any additional charge. Another method to avoid excess charge-accumulation problems is to reduce the amount of time that is used in collecting an image. This method, however, has the disadvantage of reducing sensitivity of the imaging device. Thus, dark images remain relatively dark. Hence, there is a need to extend the dynamic range of TDI-CCD devices that allows for the collection of sufficient image data to view dark images while not losing data from relatively bright images.

SUMMARY OF THE INVENTION

In accordance with the principles of the invention, a method is disclosed that increases the intra-scene dynamic range of a TDI-CCD device by selectively limiting the amount of charge collected in each stage by selectively setting blooming barrier levels. By selectively setting barrier levels, the maximum accumulated charge collected in each cell is incrementally increased as the charge is passed from one cell to a subsequent cell. In one embodiment, the level of the barrier is set in a step-wise increasing manner that limits the amount of charge collected in each stage while allowing for the accumulation of progressively greater amounts of collected charge in subsequent cells. In this embodiment, a step-wise increase in the barrier levels changes the reference level at which charge is accumulated in a cell. These changes in the reference level shift the imaging device response characteristic to cause a compression of the accumulated photonic charge for highly intense images while the response to lower intensity images is not substantially affected.

BRIEF DESCRIPTION OF THE DRAWINGS

The advantages, nature and various additional features of the invention will appear more fully upon consideration of the illustrative embodiments to be described in detail in connection with the accompanying drawings. In the drawings:

FIG. 10a illustrates a cross-sectional view of an exemplary embodiment of a back-illuminated TDI-CCD device having a response characteristic as illustrated in FIG. 8;

FIG. 10b illustrates a cross-sectional view of a second exemplary embodiment of a back-illuminated TDI-CCD device having a response characteristic as illustrated in FIG. 8; and FIG. 10c illustrates a cross-sectional view of an exemplary embodiment of a top-illuminated TDI-CCD device having a response characteristic as illustrated in FIG. 8.

It is to be understood that these drawings are for purposes of illustrating the inventive concepts of the present invention.

DETAILED DESCRIPTION OF THE INVENTION

As would be understood the principles of the invention disclosed are related to TDI-CCD array imagers. However, the principles of the invention may also be applied to other solid-state TDI imaging devices, for example, CMOS TDI-APS devices.

Figure 1:
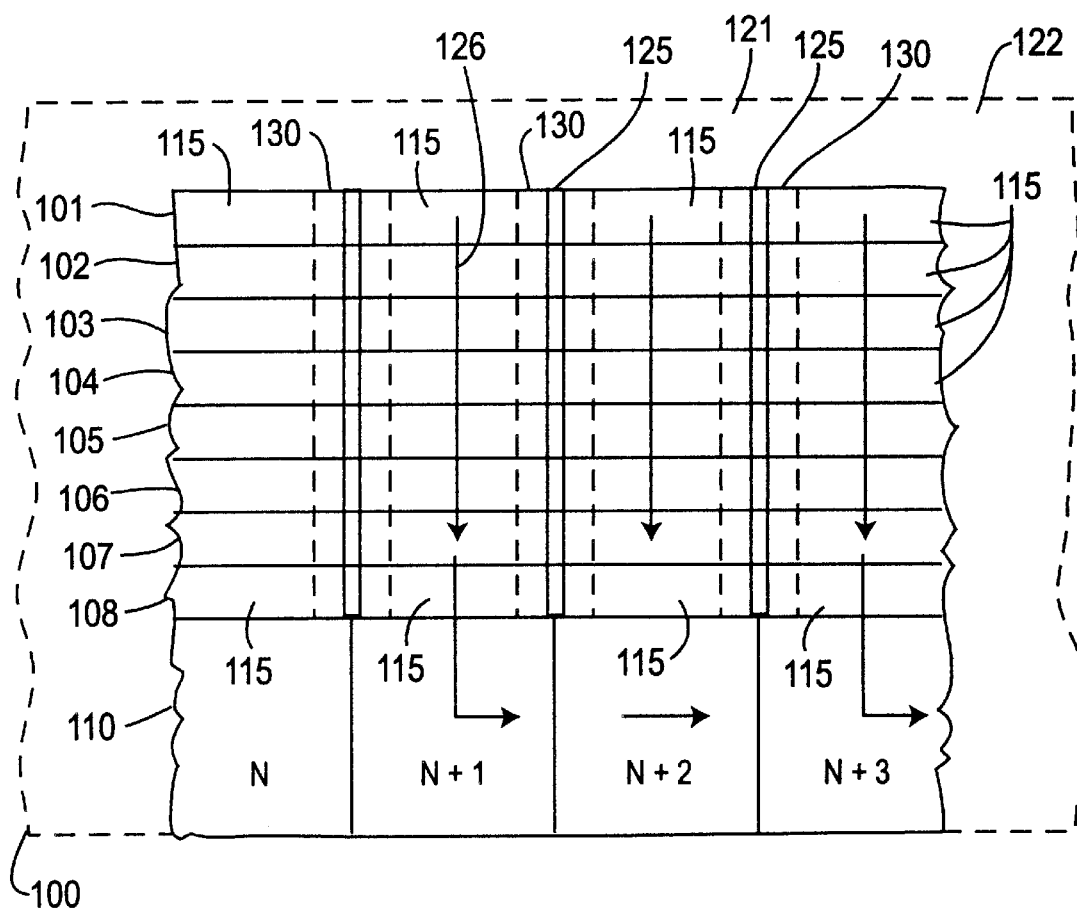
FIG. 1 illustrates a schematic diagram of an exemplary TDI-CCD device.

FIG. 1 illustrates an exemplary schematic diagram of an 8-stage TDI-CCD device 100. Only four photosensitive devices (pixel cells) 115, among a plurality of cells in each stage are shown to describe the operation of the TDI-CCD device. In operation, the photonic charge from a target image is collected beginning in pixel cells 115 associated with the first stage—i.e., stage 101. As the target image or imager moves, the image moves past the pixel cells in a next stage (102). The cells in this stage then collect photonic charge from the target image. In addition, the charge collected in previous cells is added to the charge collected in the currently-imaging cell. Thus, the charge collected in pixel cell 115 associated with stage 101, for example, is added or transferred to pixel cell 115 associated with stage 102, as the image moves past stage 102. Similarly, the accumulated charge in pixel cell 115 associated with stage 102 is added to the charge collected in pixel cell 115 associated with stage 103, as the image moves past stage 103. This transferring of accumulated photonic charge from a cell in one stage to a cell in a subsequent stage continues, one stage at a time, until an end stage is reached—in this case, stage 108. The photonic charge collected for the image is accumulated and integrated over the depth of the TDI-CCD device,—i.e., stages 101–108. At stage 110 the accumulated charge is read out from the TDI-CCD device.

In transferring the collected charge for each pixel cell 115 to a subsequent pixel cell 115, the charge is transferred along a channel of pixel cells 115, known as a transfer channel, illustrated for one channel of pixel cells as 120. When the energy collected in one cell 115 exceeds the maximum capability of the cell, the excess energy would normally overflow the cell and "spread" into an adjacent cell. To prevent the accumulated charge in the cells of one transfer channel from influencing the accumulated charge in cells in an adjacent channel, such as transfer channel 121, channels are isolated from one another by blooming drains 125 and barriers 130. The level at which accumulated charge is deemed excessive is determined by barrier 130 that exists between, for example, transfer channel 120 and drain 125. The greater the level, or potential, of barrier 130, the greater the amount of accumulated charge that may be collected in each cell 115. Generally, the levels of barrier 130 are set to achieve the maximum accumulation of charge—i.e., saturation level—in a pixel cell. As illustrated barrier 130 is positioned horizontally adjacent to channel 120 and 121. As would be known in the art, barrier 130 may also be positioned vertically adjacent to channels 120 and 121 to limit the charge capacity of pixel cell 115.

Figure 2:
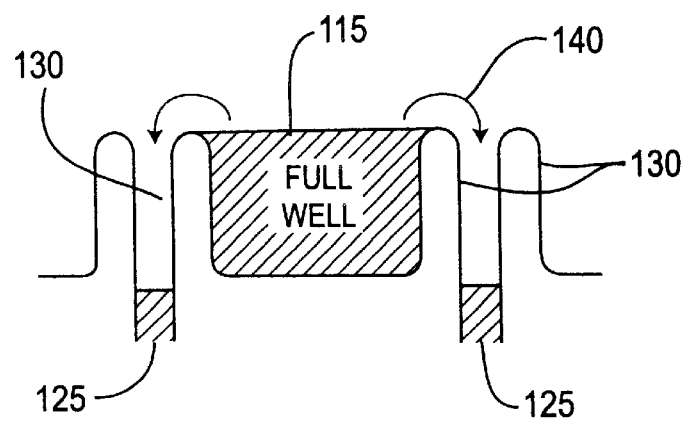
FIG. 2 depicts a cross-sectional view of a pixel cell and barrier of a CCD structure.

FIG. 2 illustrates the operation of barrier 130 in controlling excessive charge. As shown, pixel cell 115 fills to a value that is set by barrier 130. When the accumulated charge exceeds the level of barrier 130, the excess, as represented by charge 140, is directed into drain 125. In this illustrative example, when the maximum charge is achieved, any further charge that may be collected is simply discarded. The maximum level of barrier 130 thus limits the accumulated charge.

Figure 3:
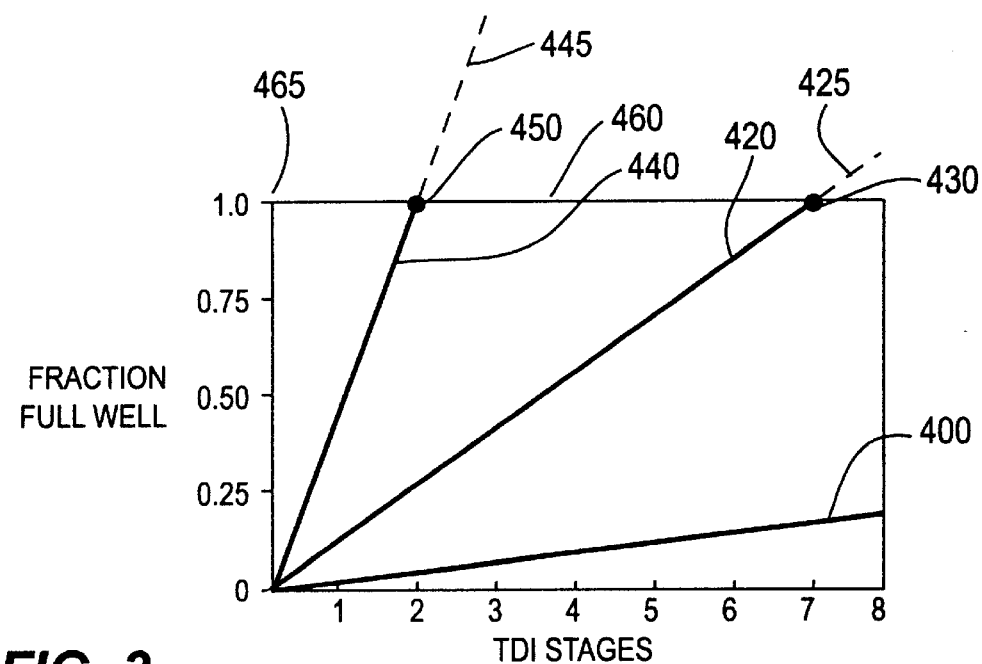
FIG. 3 illustrates typical response characteristic of a TDI-CCD device.

FIG. 3 illustrates an exemplary performance characteristic of TDI-CCD device of FIG. 1 for three images of different brightness levels. In the first example, the charge collected by the imager is represented by response characteristic 400. In this example, each pixel cell 115 in a stage adds a substantially similar amount of charge to pixel cell 115 in the next subsequent stage as the imager and target image move past each other. The accumulated charge collected increases proportionally to the number of stages in the imager. For this first exemplary image, the total amount of charge collected after the eight stages remains below the barrier level 465 set by barrier 130. In a second example, wherein the image is brighter than the first image, the charge collected is represented by response characteristic 420. In this example, more charge is collected in each pixel cell 115 (relative to that collected for response characteristic 400) as the target image and imager move past one another. The accumulated energy collected would normally continue along dashed line portion 425 of response characteristic 420 until the accumulated charge is read out at stage 110. However, when the collected charge exceeds barrier level 465 (as happens in this example near the end of the sixth CCD stage), the excess charge is drained into drain 125. The accumulated charge thus remains limited, or clipped, at the barrier level 465, as represented by response characteristic 430. Any image detail that may be captured in the dashed line portion of response characteristic 420 is not processed and is therefore lost.

As a third example, the charge of an even brighter image is collected. The response to this brighter image is represented by response characteristic 440. In this example the brightness of the image causes the accumulated charge to exceed the maximum level set by barrier 130 (at level 465) after scanning of the image by only about two of the CCD stages. Were the accumulated charge permitted to accumulate through continuing CCD stages, that charge would be represented by the dashed line portion 445 of response characteristic 440, but the charge is limited by barrier level 465. Barrier level 465 thus limits the response characteristic of the imager. Charge above barrier level 465 is simply discarded into drain 125 and the accumulated charge for this third exemplary image thus remains limited at level 465 as represented by response characteristic 460.

Figure 4:
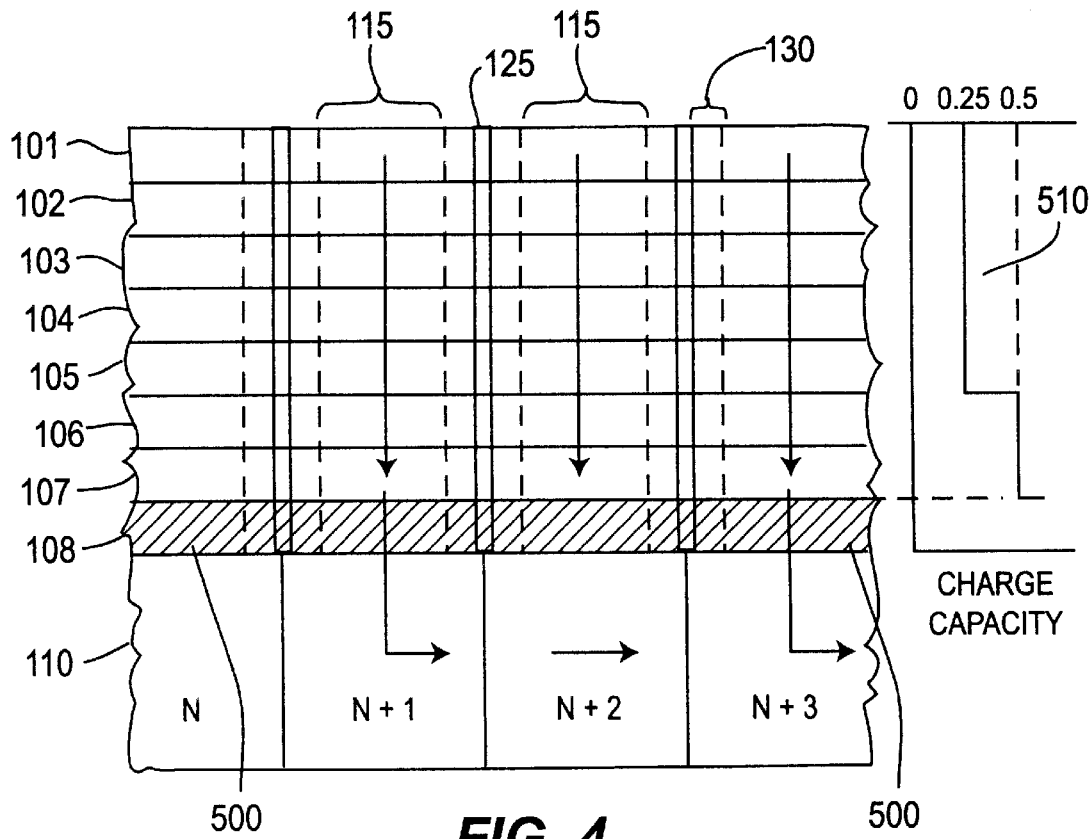
FIG. 4 illustrates a schematic diagram of a TDI-CCD device in accordance with the principles of the invention.

FIG. 4 illustrates an 8-stage TDI-CCD in accordance with the principles of the invention. As is illustrated, barrier 130 is selectively set in accordance with the capacity charge curve 510. Accordingly, the amount of charge accumulated and retained in each stage is incremental increased. In the exemplary embodiment, barrier 130 is set to limit the accumulated charge to twenty-five per cent (0.25) of maximum barrier level 465 in stages 101–105 of the imager, and fifty percent of that level for stages 106 and 107. At stage 108, the level of barrier 130 is set to the maximum barrier level 465. The maximum barrier level may be set independently of the maximum capacity of pixel cell 115, but is typically set substantially equal to the maximum capacity of the pixel cell.

In this illustrated example, barrier 130 is selectively set in an step-wise pattern that limits the amount of data collected in the early stages of collection while allowing for incrementally greater amounts of charge in latter stages. Thus, stages 101–105 accumulate 25 percent of the charge that could be collected. Stages 106 and 107 accumulate 50 percent of the charge that could be collected, and stage 108 allows for the accumulation of a maximum amount of charge. With the illustrated configuration, the maximum amount of charge may be collected without causing a saturation of pixel cell 115.

Figure 5:
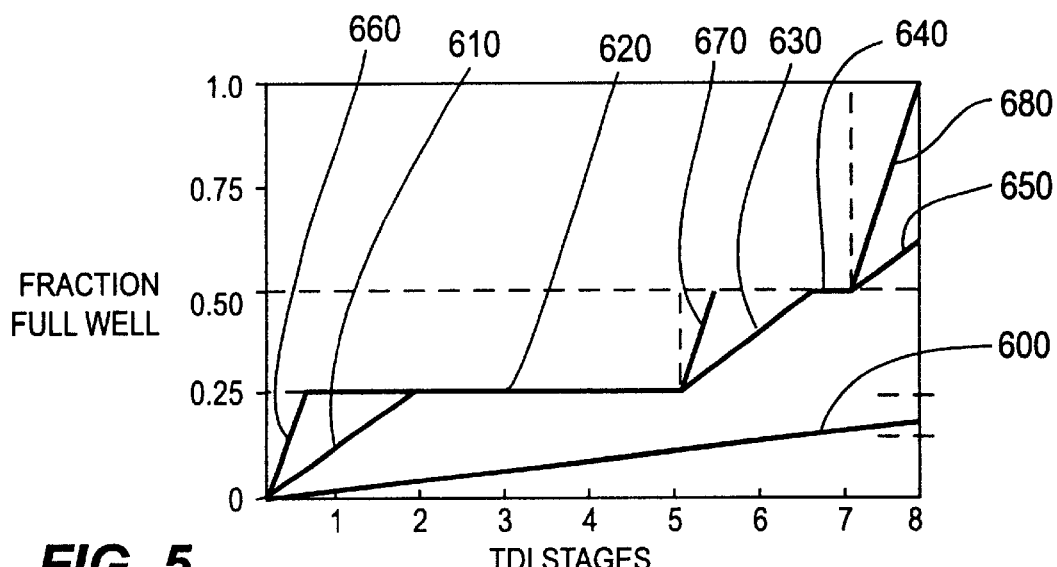
FIG. 5 illustrates a response characteristic of a TDI-CCD device illustrated in FIG. 4 in accordance with the principles of the invention.

FIG. 5 illustrates the response characteristics of a TDI-CCD device having barrier characteristics selectively set in accordance with the exemplary characteristics illustrated in FIG. 4 for the three exemplary images discussed in regard to FIG. 3. With regard to the first exemplary image (least bright), the charge collected is represented by response characteristic 600. Response characteristic 600 is similar to the response characteristic 400 of FIG. 3, as the accumulated charge does not exceed the selectively set barrier levels of stages 101–105, 106–107 or 108. Accordingly, the response characteristic is not altered and the accumulated charge is not limited.

With regard to the second exemplary image, the accumulated charge, as represented by response characteristic 610, is shown to exceed the first barrier level while charge is collected in stage 102. That is, the accumulation of the charge collected in stage 101 and the charge being collected in stage 102 exceeds the barrier level selectively set for stages 101 through 105. Any additional charge collected in stages 103 through 105 would, accordingly, cause the accumulated charge to exceed the level of barrier 130 and is thus drained off. The accumulated charge in stages 103 through 105 remains limited to 25 percent of the charge that may be collected, as represented by response characteristic 620. At stage 106, the level of barrier 130 is increased to 50 percent of the maximum barrier level to allow an incremental increase in the charge collected. As stage 106 moves past the target image, charge is accumulated in pixel cells 115 associated with stage 106. The increase in accumulated charge is represented by response characteristic 630. As shown, the accumulated charge exceeds the level of barrier 130 during the charge collection of stage 107 and the excess charge is drained off. The accumulated charge remains limited to the 50 percent level, as represented by response characteristic 640. At stage 108, the level of barrier 130 is increased to allow an incremental increase in the charge collected. As stage 108 moves past the target image, charge is accumulated, as represented by response characteristic 650. The charge level continues to accumulate until the collected charge is read out in stage 110.

In this exemplary case, the accumulated charge level is substantially less than the maximum level; hence, the brightest image data is not lost because the image data is compressed. As is illustrated, an imager incorporating a step-wise increase in the level of barrier 130 causes alterations or shifts in reference points that are used by subsequent cells to accumulate charge. These alterations in the reference points allow for the collection of more data from brighter images.

In a third exemplary image, similar to the brightest image discussed in regard to FIG. 4, the brightness of the image causes the charge collected to exceed the first level of barrier 130 during the collection phase of stage 101. Any charge collected as the target image moves past stages 101 through 105 is thus drained off. The level of the accumulated charge remains fixed at the barrier level as represented by response characteristic 620. Beginning at stage 106, the level of barrier 130 is increased. As stage 106 moves past the target image, charge is again accumulated in pixel cell 115 associated with stage 106, as represented by response characteristic 670. As shown, the brightness of the image causes the accumulated charge to quickly exceed the increased barrier level. Thus, any charge collected after this increased barrier level is exceeded is drained off. Accordingly, the accumulated charge level remains limited during stage 106 and continuing through stage 107, as represented by response characteristic 640. At stage 108, the level of barrier 130 is incrementally increased and charge is again accumulated, as represented by the response characteristic 680. In this embodiment, the brightest portions of the image are collected and the brightest portions of the image are not lost. The altered reference points compress the image data to allow pixel cells to accumulate charge that would otherwise be greater than their maximum capability. These alterations in the reference points allow for the collection of image data from brighter images that would otherwise be lost without affecting low light level performance.

In accordance with the principles of the invention, the dynamic range of a TDI-CCD device is extended by selectively setting levels of barriers that limit the charge collection capability. The selectively set barrier levels shift the reference point of accumulated charge. The altered, or shifted, reference point causes the imager to compress brighter portions of an image while not influencing the lower intensity portions of the same image.

As should be understood, the scope of the invention is not limited to the step-wise increase in charge capacity in the exemplary 8-stage TDI-CCD device illustrated. Rather the method of setting progressive barrier levels, and thereby progressively accumulating charge in a TDI-CCD device, may also be determined using, for example, exponential, logarithmic, inverse logarithmic, geometric or polynomial functions. Furtherstill, the number of barrier levels also may be increased commensurate with the number of stages in a TDI-CCD device. Thus, the number of different barrier levels may be set substantially equal to the number of stages.

Figure 6A:
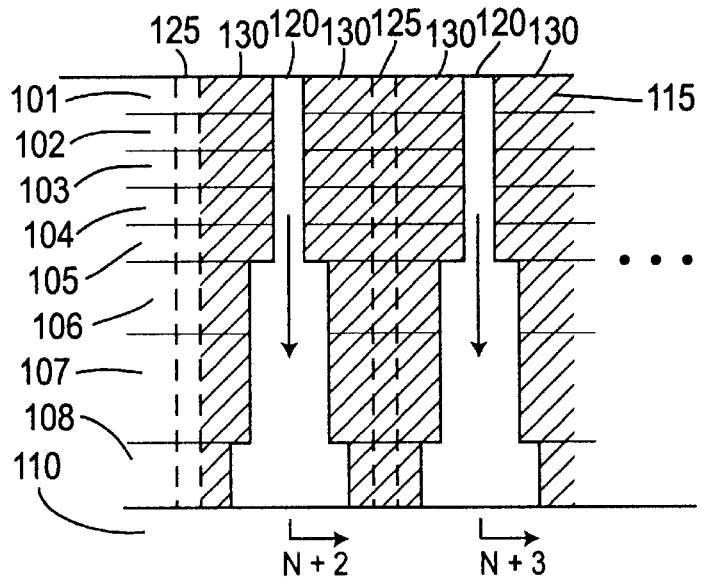
FIG. 6a illustrates one exemplary embodiment of limiting charge capacity in accordance with the principles of the invention.
Figure 6B:
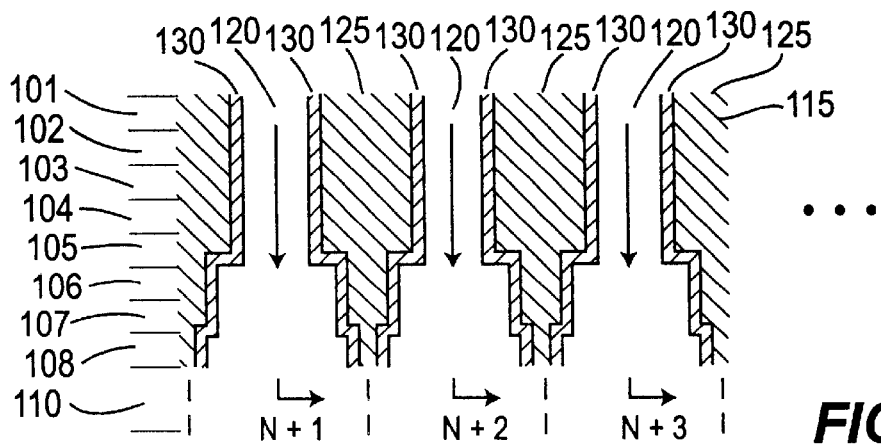
FIG. 6b illustrates a second exemplary embodiment of limiting charge capacity in accordance with the principles of the invention.

FIG. 6a illustrates one embodiment for fabricating a TDI-CCD imager having a charge capacity illustrated in FIG. 4. In this illustrative embodiment, the barrier level 130 is set to limit the amount of charge collected. For example, barrier levels are set to limit pixel cell 115 associated with stages 101 through 105 to collect only twenty-five (25) percent of full capacity of pixel cell 115—i.e., maximum level 465. For stages 106 and 107, barrier levels are set to limit pixel cell 115 associated with stages 106 and 107 to collect and retain an accumulated charge that corresponds to fifty (50) percent of full capacity. At stage 108, the barrier levels are set to the full width of pixel cell 115 to collect and retain an accumulated charge that is substantially equal to full capacity. FIG. 6b illustrates a second embodiment for fabricating a TDI-CCD imager having a charge capacity illustrated in FIG. 4. In this embodiment, the barrier levels, or potentials, are constant but are positioned to adjust the width of pixel cells 115 to limit the charge collected. In this case, the amount of charge collected is limited by the size of the pixel cells. Further, the width of barrier level 130 remains substantially constant.

Figure 7A:
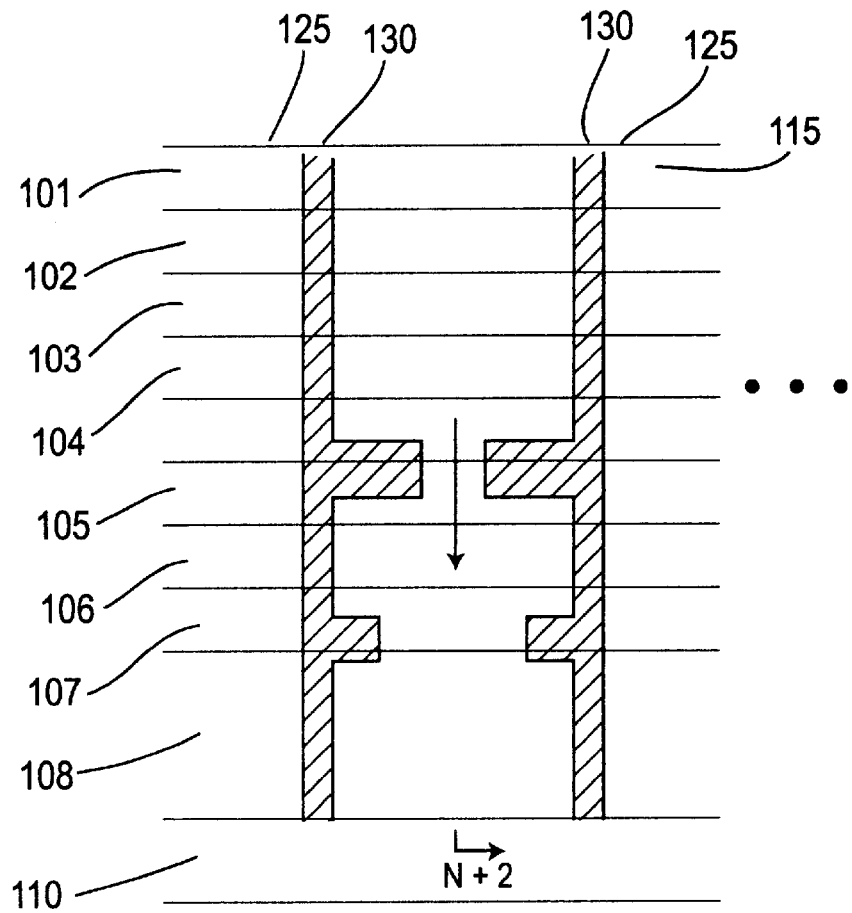
FIG. 7a illustrates a third exemplary embodiment of limiting charge capacity in accordance with the principles of the invention.
Figure 7B:
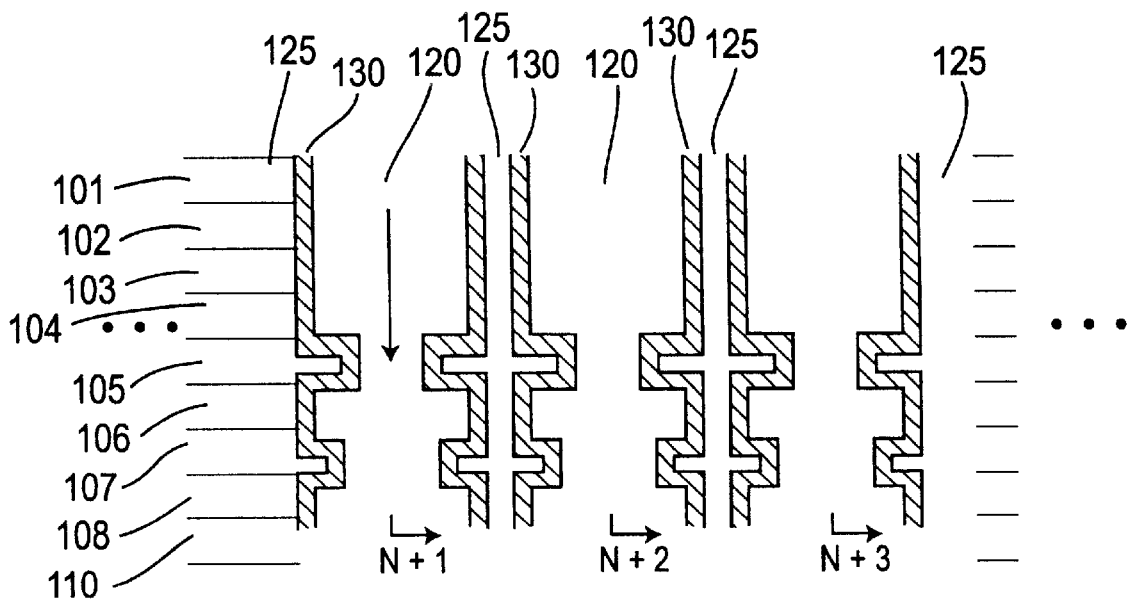
FIG. 7b illustrates a fourth exemplary embodiment of limiting charge capacity in accordance with the principles of the invention.

FIG. 7a illustrates a second embodiment of fabricating a TDI-CCD device to achieve the exemplary step-wise accumulated charge characteristics illustrated in FIG. 4. In this embodiment, the pixel cell charge capacity is set in designated stages to limit the accumulated charge. As illustrated, the width of pixel 115 in stages 101 through 104 is set at a maximum level 465—i.e., full collection capacity. At stage 105, the width of pixel 115 is reduced to twenty-five (25) percent of maximum level 465. At stage 106, the width of pixel 115 is again increased to maximum level 465, and at stage 107, the width of pixel 115 is reduced to fifty (50) percent of maximum level 465. Finally, at stage 108, the width of pixel 115 is again increased to maximum level 465. The narrow channel regions at stages 105 and 107 act as charge clippers. FIG. 7b illustrates another embodiment, similar to that described in regard to FIG. 7a, wherein the width of barrier 130 is remains substantially constant. This embodiment is advantageous as the width of drain 125 is correspondingly increased when the size of pixel 115 is decreased. This increase in drain 125 allows for the draining of excessive accumulated charge.

In another embodiment, which is not illustrated, the depth of the pixel cell 115, as illustrated in FIG. 2, may also be used to control pixel charge capacity. For 8-stage TDI-CCD device discussed herein, the depth of pixel cells 115 associated with stages 101–105 may be set to collect twenty-five percent of full charge capacity. Similarly, the depth of pixel cells 115 associated with stages 106–107 may be set to collect fifty percent of full charge capacity and the depth of pixel cell 115 associated with stage 108 may be set to accumulate a full charge.

Figure 8:
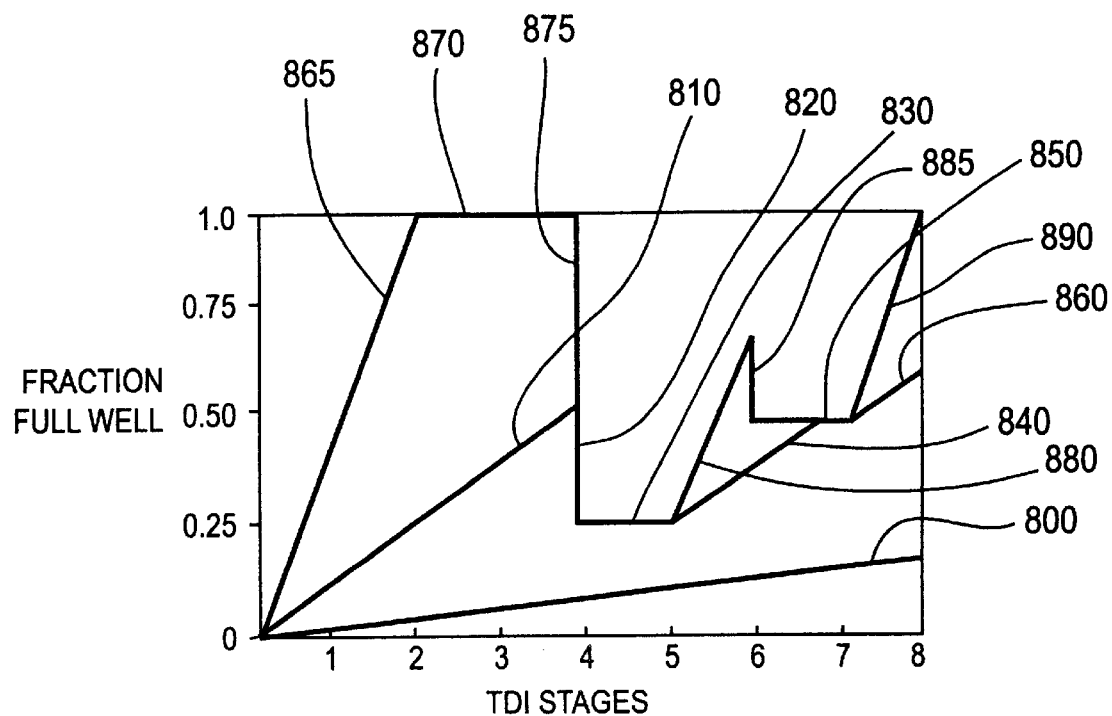
FIG. 8 illustrates an exemplary response characteristic of a TDI-CCD device in accordance with a second embodiment of the invention.

FIG. 8 illustrates the response characteristics of this embodiment of the invention to the three exemplary images discussed in regard to FIG. 3 and FIG. 5. The response characteristic to the first exemplary image is represented by the response characteristic 800. As discussed previously, the accumulated charge in stages 101 through 108 remains lower than the associated barrier levels. Thus, the selectively set levels do not influence the response characteristic of the TDI-CCD device to this first exemplary image. With regard to the second exemplary image as discussed in regard to FIG. 3, the charge accumulated in stages 101 through 104, as represented by response 810, rises to maximum level 465. At stage 105, however, the charge capacity of pixel cell 115 is set to twenty-five percent of maximum level 465. Accordingly, as the target image passes stage 105, the accumulated charge above this twenty-five percent level is drained off, as represented by response 820. Furthermore, any additional charge collected during stage 105 is also drained off. Thus, the accumulated charge remains limited, as represented by response characteristic 830. At stage 106, the charge capacity of pixel cell 115 is again increased to maximum level 465 and charge is again accumulated, as represented by response characteristic 840. At stage 107, the charge capacity of the associated pixel cell 115 is reduced to fifty percent. Any charge collected above this fifty-percent level is, accordingly, drained off and the accumulated charge remains at a fixed level, as is represented by response characteristic 850. At the beginning of stage 108, the charge capacity of the associated pixel cell 115 increased to maximum level 465 and charge again is accumulated, as represented by response characteristic 860. Accordingly, the brighter portions of the imager are again captured in the imaging device similar to that illustrated in FIG. 5.

With regard to the third exemplary image as discussed in regard to FIG. 3, the accumulated charge quickly rises to maximum level 465, as illustrated by response characteristic 865. Any additional charge that may be collected in stages 102–104 is drained off, as represented by response characteristic 870. At stage 105, the charge capacity of the associated pixel cell 115 is set at twenty five percent and any accumulated charge above this level is drained off, as represented by response characteristic 875. Further, any additional charge collected is similarly drained off and the accumulated charge level remains constant, as represented by response characteristic 830. At stage 106 the charge capacity of the associated pixel cell 115 is again increased to maximum level 465. The charge is again accumulated, as represented by response characteristic 880. At the beginning of stage 107, the charge capacity of the associated pixel cell 115 is again reduced to fifty percent, and the accumulated charge above this reduced level is again drained off, as represented by response characteristic 885. The accumulated charge remains fixed at this level as any additional charge collected is drained off, as represented by response characteristic 850. At stage 108, the charge capacity of the associated pixel cell 115 is again increased and the accumulated charge again increases, as represented by response 890. The brightest portions of this third exemplary image are thus captured in a manner similar to that illustrated in FIG. 5.

It should be understood, the representation of the transfer channel having varying size is intended merely to illustrate different methods of achieving the exemplary model of varying barrier levels. Other methods may also be used to achieve similar increases in accumulated charge.

A further means of increasing dynamic range is achieved by placing a filtering element over at least one stage of a TDI-CCD device. Filter elements are used to further extend dynamic range by reducing the intensity of an image as the image moves with respect to the collection stages. FIG. 4 illustrates the placement of filter 500 over stage 108. In this embodiment, in addition to selectively setting of barrier levels, filter 500 is used to reduce the image intensity as the image passes stage 108. Filter 500 may be, for example, a neutral-density filter, or a slotted metal filter. Filtering is well known in the art and need not be discussed in detail herein.

Figure 9:
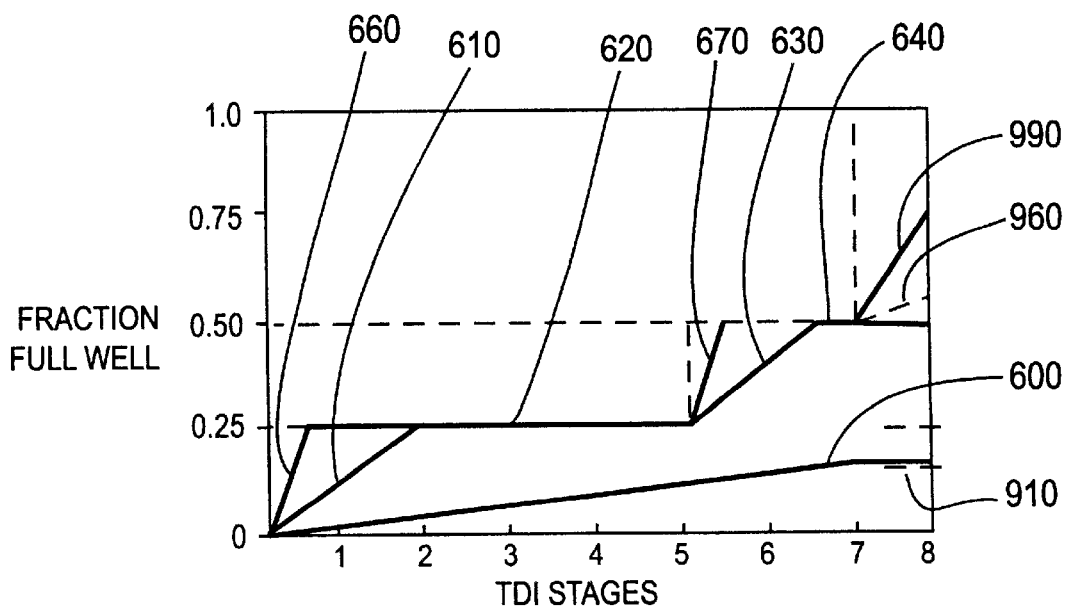
FIG. 9 illustrates an exemplary response characteristic of a TDI-CCD device in accordance with another embodiment of the invention.

FIG. 9 illustrates the response characteristic of the TDI-CCD imager illustrated in FIG. 4 with filter 500 positioned over stage 108. In this case, the response to the three exemplary images is similar to the responses illustrated in FIG. 5, except for the response in the filtered stage. That is, the response of this embodiment to the first exemplary image is similar to response characteristic 600 of FIG. 5. However, the imposed filter 500 causes the image intensity to decrease during charge collection at stage 108. The amount of charge collected is thus reduced and this reduction in the accumulated charge is represented by response characteristic 910. Similarly, the responses of the second and third exemplary images, as illustrated in FIG. 9 are equivalent to corresponding responses illustrated in FIG. 5, except for the response during stage 108. With the imposed filter 500 placed over stage 108 the charge collection is reduced as represented by response characteristics 960 and 990, respectively. Thus, in accordance with the principles of the present invention, dynamic range of TDI-CCD is further extended by selectively using filters over at least one collection stage to collect highly intense images.

FIG. 10*a* illustrates a cross-sectional view of an exemplary embodiment of an 8stage back-illuminated TDI-CCD imager incorporating filtering over one stage (stage 108). FIG. 10*b* illustrates a cross-sectional view of a second exemplary embodiment of an 8-stage back-illuminated TDI-CCD imager incorporating filtering over one stage (stage 108). As would be understood the principles of the invention are equally applicable to top-illuminated TDI-CCD imagers. FIG. 10*c* illustrates a cross-sectional view of an exemplary embodiment of an 8-stage top-illuminated TDI-CCD imager incorporating filtering over one stage (stage 108).

Using FIG. 10*a* as an illustrative example of TDI-CCD device constructed in accordance with the principles of the invention, light energy 1040 from a target image is sequentially collected in each of the collection stage as imager 1010 moves past the target image in the direction 1050. As illustrated, TDI-CCD imager 1010 is composed of eight (8) stages,—i.e., stages 101–108. Stages 101–108 are formed in wafer 1000, which is typically made of a semi-conductor material, such as silicon or GaAs.

Attached to wafer 1000 is block 1020. Block 1020 provides support and protection for wafer 1010. Typically block 1020 is an optically transparent material. For example, for imagers used in the visible light range, block 1020 may be constructed of materials such as glass, plastic, acrylic or polymer, that allows light 1040 to pass without significant degradation or loss. For imagers operating in the IR region, block 1020 may be constructed of materials such as silicon. For imagers operating in the UV region, block 1020 may be materials such as quartz and calcium chloride.

Filter 1030 is positioned on surface 1070 between block 1020 and wafer 1010. Filter 1030, similar to filter 500 discussed previously, is positioned over stage 108 to reduce the charge collected in this stage. As should be understood, the placement of filter 1030 is not limited to surface 1070, as illustrated. Rather, filter 1030 may be placed, for example, on surface 1060, or may even be incorporated within block 1020 to achieve a reduction in the intensity of the image. For example, a filter may be included within block 1020, by altering the index of reflective of the material of block 1020. The altered index of reflective reduces the intensity of light that traverses block 1020 and is collected in stages 101-108 in wafer 1000. Further still, filter 1030 may be incorporated onto wafer 1010. However, placing filter 1030 on wafer 1010 has the disadvantage that when a change of filtering is necessary wafer 1010 is affected. Accordingly, incorporating filter 1030 onto block 1020 allows for filter changes without affecting wafer 1010.

Filters may be used over a plurality of stages and each of these filters need not cause the same reduction in image intensity. For example, filters may be graduated along the depth of a TDI-CCD such that no filtering occurs in the earlier collection stages while significant reductions of intensity occurs in the latter collection stages. Graduated filtering, thus, does not affect the low intensity portions of any image but will affect the brighter portions, as illustrated in FIG. 9.

The examples given herein are presented to enable those skilled in the art to more clearly understand and practice the instant invention. The examples should not be considered as limitations upon the scope of the invention, but as merely being illustrative and representative of the invention. Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claims is reserved.

What is claimed is:

1. An imaging apparatus having a plurality of photosensitive cells arranged in a plurality of rows, said cells providing an output representing a measure of accumulated charge, comprising at least one channel of photosensitive cells, said channel having at least one photosensitive device from each of said rows wherein said accumulated charge in one of said cells is available to a subsequent one of said cells within said channel;

at least one barrier level coupled to each of said at least one channel, said barrier limiting the amount of said accumulated charge collected in said photosensitive cells, wherein said barrier is configured to cause alterations in charge capacity of the subsequent one of said photosensitive cells to incrementally increase said accumulated charge capacity in the subsequent one of the cells relative to the one of said cells; and means for removing excessive accumulated charge.

2. The imaging apparatus as recited in claim 1 further comprising at least one filter, said at least one filter reducing said charge collected in said cell corresponding to said filter.

3. The imaging apparatus as recited in claim 2 wherein said filter is a neutral density filter.

4. The imaging apparatus as recited in claim 2 wherein said filter is a slotted filter.

5. The imaging apparatus as recited in claim 2 further comprising an optically transparent block, wherein said filter is attached to said block.

6. The imaging apparatus as recited in claim 5 wherein said optically transparent block is chosen from the group of glass, plastic, acrylic, or polymer.

7. The imaging apparatus as recited in claim 5 wherein said optically transparent block from the group of quartz and calcium chloride.

8. The imaging apparatus as recited in claim 5 wherein said optically transparent block is silicon.

9. The imaging apparatus as recited in claim 1 wherein said photosensitive cells are charged-coupled devices.

10. The imaging apparatus as recited in claim 1 wherein said barrier level is set as a potential.

11. The imaging apparatus as recited in claim 1 wherein said barrier level is set by positioning said barrier in said channel.

12. The imaging apparatus as recited in claim 1 wherein said barrier level is set to allow a step-wise linear increase in said accumulated charge.

13. The imaging apparatus as recited in claim 1 wherein said barrier level is set to reduce said accumulated charge in designated ones of said plurality of rows.

14. The imaging apparatus as recited in claim 1 wherein said barrier level in each of said rows is set in accordance with a known relation to cause an incremental increase in a response characteristic of said imaging apparatus.

15. The imaging apparatus as recited in claim 1 wherein said barrier level is set in accordance with a relation selected from the group of exponential, logarithmic, inverted logarithmic geometric and polynomial functions.

16. A method of operating an image sensing device which includes a plurality of photosensitive cells arranges in a plurality of rows, said cells further arranged in channels wherein charge collected within one of said cells is transferable to one of said cells within said channel, comprising the steps of:

creating at least one barrier coupled to said channels;

setting a barrier level for each of said at least one barrier to allow said charge to accumulate in said cells, wherein the amount of charge transferred from one of said cells to subsequent one of said cells is incrementally increased.

17. The method as recited in claim 16 further comprising the step of:

applying filtering selectively to said image sensing device to reduce the image sensing capability.

18. The method as recited in claim 16 wherein said step of setting said barrier levels includes setting said barriers levels to allow a step-wise increase in accumulated charge.

19. The method as recited in claim 16 wherein said step of setting said barrier levels includes setting said barriers levels to reduce said accumulated charge in designated ones of said plurality of rows.

20. The method as recited in claim 16 wherein said step of setting said barriers includes setting each of said barriers levels in each of said rows in accordance with a known relation causing an incremental increase in a response characteristic of said image sensing device.

21. The method as recited in claim 16 wherein the step of setting said barrier level includes setting said barrier levels using a relation selected from the group of exponential, logarithmic, inverted logarithmic, geometric and polynomial functions.

22. The method as recited in claim 16 wherein said barrier level is set as a potential.

23. The method as recited in claim 16 wherein said barrier level is set by positioning said barrier in said channel.

* * * * *